United States Patent
Choong et al.

[11] Patent Number: 6,064,151
[45] Date of Patent: May 16, 2000

[54] ORGANIC ELECTROLUMINESCENT DEVICE WITH ENHANCED PERFORMANCE

[75] Inventors: Vi-en Choong, Tempe; Ji-Hai Xu, Gilbert; Franky So, Tempe; Song Q. Shi, Phoenix, all of Ariz.

[73] Assignee: Motorola, Inc., Schaumburg, Ill.

[21] Appl. No.: 08/986,621

[22] Filed: Dec. 8, 1997

[51] Int. Cl.[7] .................................................. H01J 1/62
[52] U.S. Cl. ........................ 313/504; 313/506; 313/507
[58] Field of Search ............................... 313/500, 502, 313/503, 504, 505, 506, 507, 509, 498; 428/690, 691, 917; 257/40, 98, 103

[56] References Cited

U.S. PATENT DOCUMENTS

| | | | |
|---|---|---|---|
| 5,429,884 | 7/1995 | Namiki et al. | 313/504 X |
| 5,739,635 | 4/1998 | Wakimoto | 313/498 X |
| 5,773,929 | 6/1998 | Shi et al. | 313/504 |
| 5,776,622 | 7/1998 | Hung et al. | 313/504 X |
| 5,776,623 | 7/1998 | Hung et al. | 313/504 X |
| 5,909,081 | 6/1999 | Eida et al. | 313/504 |
| 5,920,080 | 7/1999 | Jones | 313/509 X |

*Primary Examiner*—Nimeshkumar D. Patel
*Assistant Examiner*—Mack Haynes
*Attorney, Agent, or Firm*—William E. Kock

[57] ABSTRACT

An organic electroluminescent device with enhanced performance includes anode and cathode electrodes with organic material, single or multiple layers, positioned therebetween and in juxtaposition to each of the electrodes. The organic material is doped with an AMC dopant with a concentration in a range of approximately 0.1 Wt % to 15 Wt % in a region of the organic material adjacent to the cathode electrode. This doped region has a thickness in a range of approximately 20 Å to 600 Å. The dopant includes either a low work function alkaline metal compound, such as LiF, LiCl, KBr, $MgF_2$, $LiO_2$, $MgO_x$, $CaO_x$, and $CsO_x$ or a low work function alkaline metal alloy, such as Li—Al, Li—In, Sr—Al, Cs—Al.

10 Claims, 1 Drawing Sheet

ORGANIC ELECTROLUMINESCENT DEVICE WITH ENHANCED PERFORMANCE

FIELD OF THE INVENTION

This invention relates to an organic electroluminescent devices (OED). More specifically, this invention relates to devices with enhanced performance as a result of doping with alkaline metal compounds and alloys.

BACKGROUND OF THE INVENTION

Organic electroluminescent devices (OED) are generally composed of single or multiple layers of organic materials sandwiched between transparent and metallic electrodes. OEDs are attractive owing to the requirement for low driving voltage and the fact that they are generally simple and relatively easy and inexpensive to fabricate even for sizes as small as a tenth of a millimeter in diameter. Furthermore, the light generated by OEDs are sufficient for use in a variety of ambient light conditions (from little or no ambient light to bright ambient light). Because of these advantages OEDs have a potential application in full color flat emissive displays as well as displays in small products, such as pagers, cellular and portable telephones, two-way radios, data banks, etc.

A major problem with OEDs is the injection barrier between the electrical contacts and the carrier transporting layers, which reduces the efficiency of the device. To avoid this problem, better band alignment between the contacts and the organic layers is needed. In the prior art, this is primarily done by using low work function metals such as Li, Ca and Mg as the cathode. These metals are highly susceptible to moisture which complicates the fabrication and encapsulation process resulting in an increase in cost. Other methods utilized to increase the device efficiency involve the use of dopants, such as N,N'-dimethylquinacridone as the primary fluorescer. Though significant improvements in the performance of OEDs have been achieved in this manner in the prior art (See U.S. Pat. No. 5,593,788), these devices still employ reactive metals as the cathode.

Accordingly, it would be beneficial to provide an OED which avoids these problems.

It is a purpose of the present invention to provide for an efficient and stable OED without the use of reactive metals and a method of fabrication.

It is another purpose of this invention to provide for a new method to enhance carrier injection into the organic electroluminescent medium of an OED without the use of reactive metals.

It is further purpose of the present invention to provide organic electroluminescent devices with enhanced charge transport.

It is a further purpose of this invention to provide for an OED with improved performance and reliability.

SUMMARY OF THE INVENTION

The above problems and others are at least partially solved and the above purposes and others are realized in an organic electroluminescent device with enhanced performance and method of fabrication including anode and cathode electrodes with organic material defining an electroluminescent region positioned therebetween and in juxtaposition to each of the electrodes. The organic material is doped with an alkaline metal compound dopant (AMCD) in a region of the organic material adjacent the cathode electrode to facilitate electron injection. The dopant is also believed to facilitate charge transport and increase the free charge concentration in the doped region.

In a preferred embodiment the AMCD dopant includes either a low work function alkaline metal compound, such as LiF, LiCl, KBr, $MgF_2$, $LiO_2$, or a low work function alkaline metal alloy, such as Li—Al, Li—In, Sr—Al, Cs—Al. Also, the doped region preferably has a concentration in a range of approximately 0.1 Wt % to 15 Wt % and a thickness in a range of approximately 20 Å to 600 Å.

BRIEF DESCRIPTION OF THE DRAWINGS

Referring to the drawings.

DESCRIPTION OF THE PREFERRED EMBODIMENT

While the specification concludes with claims defining the features of the invention that are regarded as novel, it is believed that the invention will be better understood from a consideration of the following description in conjunction with the three figures.

Figure 1:
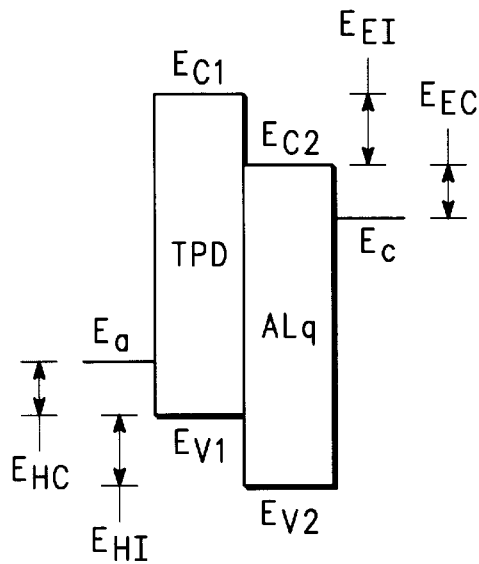
FIG. 1 is a schematic band diagram for all the layers constituting a typical OED with cell structure of ITO//TPD//Alq//MgAg.

In a typical OED, tris-(8-hydroxy quinoline) aluminum (Alq) has often been used in the electron transport layer as an electron transporting material, while an aromatic diamine such as N,N'-diphenyl-N,N'-bis(3-methylphenyl)-[1,1'-biphenyl]-4,4'-diamine (TPD) has often been used in the hole transport layer as a hole transporting material. A schematic band diagram for all the layers constituting a typical organic EL device of this type is shown in FIG. 1 for purposes of this explanation. The energy barrier for electron injection from the conduction band of Alq ($E_{c,Alq}$) to the conduction band of TPD ($E_{C,TPD}$) is about 0.7 eV, while the energy barrier for hole injection from the valence band of TPD ($E_{V,TPD}$) to the valence band of Alq ($E_{V,Alq}$) is about 0.3 eV. Therefore, holes are more easily injected into the Alq layer, and electrons will more likely accumulate in a region of the Alq layer close to the Alq/TPD interface. Consequently, the emission occurs in this region of the Alq layer where electrons and holes recombine.

Various energy levels and carrier barriers are also illustrated in FIG. 1. The work function of the anode is $E_a$, the work function of the cathode is $E_c$, the conduction band level, and the valence band level of the hole transporting layer (TPD) are $E_{C1}$ and $E_{V1}$, respectively, and the conduction band level and the valence band level of the electron transporting layer (Alq) are $E_{C2}$ and $E_{V2}$, respectively. A contact hole injection barrier $E_{HC}$, represents the energy level between the work function $E_a$ of the anode and the valence band $E_{V1}$ of the hole transporting layer which holes must overcome to be injected from the anode into the hole transporting layer. An interlayer hole injection barrier $E_{HI}$, represents the energy level between the valence band $E_{V1}$ of the hole transporting layer and the valence band $E_{V2}$ of the electron transporting layer which holes must overcome to be injected from the hole transporting layer into the electron transporting layer. A contact electron injection barrier $E_{EC}$, represents the energy level between the work function $E_c$ of the cathode and the conduction band $E_{C2}$ of the electron transporting layer which electrons must overcome to be injected from the cathode into the electron transporting layer. An interlayer electron injection barrier $E_{EI}$ represents the energy level between the conduction band $E_{C2}$ of the electron transporting layer and the conduction band $E_{C1}$ of the hole transporting layer which electrons must overcome to be injected from the electron transporting layer into the hole transporting layer.

Figure 2:
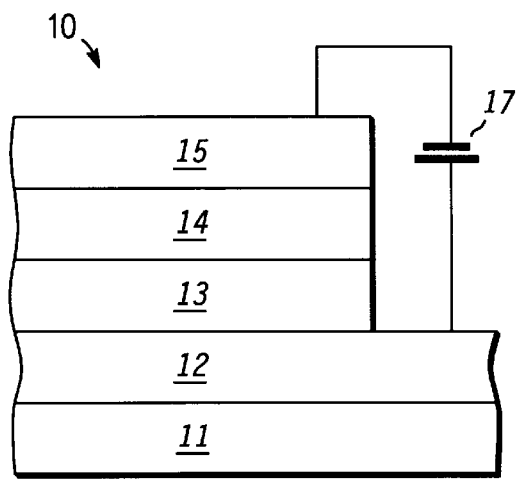
FIG. 2 is a simplified sectional view of the OED of FIG. 1.

Turning now to FIG. 2 a simplified cross-sectional view is illustrated for further understanding of this explanation, of a typical OED 10 which may be utilized in the present invention. Device 10 is fabricated upon a first substrate 11 which is transparent and may be fabricated of any of the number of known materials employed in the art. For example, substrate 11 may be fabricated of a glass, such as a Corning 7059 glass, transparent plastic substrates made of polyolefins, polyethersulfones, polyarylates, a silicon wafer, or the like. In one preferred embodiment, substrate 11 is fabricated of glass of quality good for flat panel display applications.

Deposited atop substrate 11 is a first conductive layer, or first electrode, 12 (anode), which is electrically conductive and optically transparent or semi-transparent. In this particular embodiment, first electrode 12 is characterized as having p-conductivity. Several materials may be advantageously employed as first electrode 12 for an OED device. Examples of materials include conductive metal oxides such as indium oxide, indium-tin oxide (ITO), zinc oxide, zinc-tin oxide, and conductive transparent polymers such as polyaniline. In one preferred embodiment, electrode 12 is fabricated of ITO or zinc oxide.

Thereafter, atop the first electrode 12 is deposited a hole transporting layer 13 made of organic hole transporting materials. Thereafter deposited atop hole transporting layer 13 is an electron transporting layer 14 made of an electron transporting material. Finally, a second electrically conductive layer 15 is deposited on the upper surface of 14 to form a second electrical contact.

Conductive layer 15 is typically formed of a metal or a metal alloy selected from a group of lithium, magnesium, calcium, strontium, aluminum, indium, copper, gold, silver, or a combination of above in which at least one metal has a work function less than 4.0 eV. In this particular embodiment electrode, 15 is characterized as having n-conductivity. Previously, by the proper selection of material for conductive layer 15, the work functions of the materials making up layers 14 and 15 were substantially matched to reduce the required operating voltage and improve the efficiency of OED 10. Additional information on this type of work function matching is disclosed in a copending U.S. Patent Application entitled "Organic LED with Improved Efficiency", filed Sep. 12, 1994, bearing Ser. No. 08/304, 454, and assigned to the same assignee.

When a potential is applied between first and second electrodes 12 and 15 by means of connecting opposite terminals of a potential source 17 to first electrode 12 and second electrode 15, holes are injected from first electrode 12 into hole transporting layer 13 and electrons are injected from second electrode 15 into electron transporting layer 14, wherein upon an electron and a hole recombination a photon is emitted.

Figure 3:
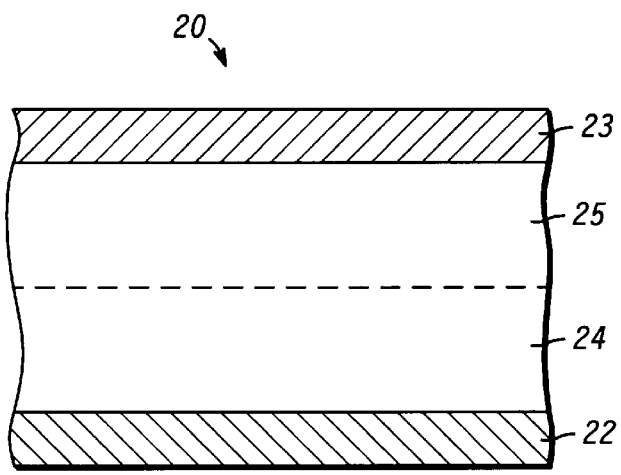
FIG. 3 is a greatly enlarged and simplified view in cross-section of an organic light emitting device in accordance with the present invention.

Turning now to FIG. 3, a greatly enlarged and simplified view in cross-section of an OED 20 in accordance with the present invention is illustrated. OED 20 includes an anode electrode 22, a cathode electrode 23 and organic electroluminescent element 24 positioned between anode electrode 22 and cathode electrode 23. Organic electroluminescent element 24 is in juxtaposition to each of the electrodes and defines an electroluminescent region therein. It will be understood that organic electroluminescent element 24 may be either a single layer (see copending United States Patent Application entitled "Organic Electroluminescent Device with Continuous Organic Medium" Ser. No. 08/893,116, filed Jul. 15, 1997, and assigned to the same assignee) or multiple layers, an example of which is illustrated in FIG. 2.

In accordance with the present invention, an alkaline metal compound (AMC) dopant (AMCD) is dispersed in doped region 25, a sub-region of organic electroluminescent element 24 which is adjacent to cathode electrode 23. Generally, the AMCD dopant is a low work function alkaline metal compound, such as LiF, LiCl, KBr, $MgF_2$, $LiO_2$, or an alkaline metal alloy, such as Li—Al, Li—In, Sr—Al, and Cs—Al. The doping is easily accomplished in a variety of ways, including co-evaporation of the AMC dopant and the organic material during deposition of doped region 25. The concentration of the AMC dopant can be varied in a range of approximately 0.1 Wt % to 15 Wt %, where the "Wt %" is the weight of the AMC dopant to the final doped organic material (e.g. 0.5 Wt % of AMC dopant with 95.5 Wt % of organic material). Also, doped region 25, in a preferred embodiment, is formed with a thickness in a range of approximately 20 Å to 600 Å.

The work function of a binary compound generally depends on the work function of the lower electronegativity in the two elements. Thus, the work function of the AMC dopant (compounds or alloys) is dictated by the work function of the alkaline metals. Therefore, the work function of doped region 25 is influenced by the AMC dopants, thereby reducing the barrier height to electron injection from cathode electrode 23 into doped region 25. The reduced barrier height facilitates the injection of electrons and improves the operating characteristics of OED 20.

Further, a side effect of the doping in doped region 25 is an increase in the stability of OED 20 which increases the reliability of OED 20. The major reason for the increased stability is the stabilizing effect of the dopant on organic material in doped region 25. In addition, further diffusion of the dopant which may degrade the device is unlikely due to the size of the dopant molecules. Also, OED 20 does not include highly reactive metals and the like which complicates the fabrication and encapsulation process of device 20.

Another advantage that is realized by doping region 25 with an AMC dopant is that the free charge concentration is increased. That is, there are more charges (electrons) free to be transported to the electroluminescent region. This increased free charge concentration facilitates charge transportation through doped region 25. Thus, the efficiency of OED 20 is substantially improved.

Thus, organic electroluminescent devices with enhanced performance, and higher device efficiency, due to enhanced carrier injection and transport, are disclosed. Also, greater reliability is expected due to the stabilizing effect of the dopant on the organic material. The organic electroluminescent devices also exclude the use of reactive metals which improves the life and reliability of the devices and greatly simplifies the manufacturing process of the final device.

EXAMPLES

The invention and its advantages are further illustrated by the specific examples which follow.

Example 1

Fabrication Procedure

An EL device satisfying the requirements of the invention was constructed in the following manner. The device structure has a three organic-layer stack, namely hole-injecting layer, hole transporting layer, and electron transporting layer which also serves as the fluorescent emitting layer.

(a) An indium tin-oxide coated glass substrate was sequentially ultrasonicated in Acetone, and Isopropryl Alcohol, blown dry and exposed to ultraviolet light and ozone for a few minutes.

(b) A hole injecting layer of copper phthalocyanine (375 Å) was then deposited on top of the ITO coated substrate by evaporation.

(c) Onto the copper phthalocyanine layer was deposited a hole transporting layer of N,N'-Bis-(1-Naphthyl)-N,N'-Diphenylbenzidine (NPB,375 Å), also by evaporation.

(d) A fluorescent emitting layer of Alq (700 Å) was then deposited onto the hole transporting layer by evaporation. The final 300 Å of this Alq layer was doped with LiF via coevaporation. The typical rate for Alq was 1 Å/s, and the rate for LiF was adjusted according to the concentration desired.

(e) On top of the Alq layer was deposited a 1000 Å thick layer of Al as the cathode.

The above sequence completed the deposition of the EL device. The device was then hermetically sealed in a dry glove box for protection against ambient environment.

Example 2

Device Performance

The EL devices were fabricated according to the procedure of Example 1. The concentration of the LiF dopant in the fluorescent emitting layer was varied. Table 1 lists the luminance output under a constant current bias of 20 mA/cm$^2$, and the device quantum efficiency measured in unit of Cd/A.

TABLE 1

| LiF Concentration (wt. %) | Luminance (Cd/m$^2$) | Quantum Efficiency (Cd/A) |
|---|---|---|
| 0 | 250 | 1.25 |
| 1.5 | 855 | 4.27 |
| 3 | 950 | 4.75 |
| 4 | 885 | 4.43 |
| 6 | 844 | 4.22 |

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An organic electroluminescent device with enhanced performance comprising:

anode and cathode electrodes;

organic material positioned between the anode and cathode electrodes in juxtaposition to each of the electrodes, the organic material defining an electroluminescent region; and AMC dopant in a region of the organic material adjacent the cathode electrode.

2. An organic electroluminescent device as claimed in claim 1 wherein the AMC dopant includes one of an alkaline metal compound or an alkaline metal alloy.

3. An organic electroluminescent device as claimed in claim 2 wherein each of the alkaline metal compound and the alkaline metal alloy have a low work function.

4. An organic electroluminescent device as claimed in claim 2 wherein the alkaline metal alloy includes one of Li—Al, Li—In, Sr—Al, and Cs—Al.

5. An organic electroluminescent device as claimed in claim 1 wherein the region of the organic material adjacent the cathode electrode having the AMC dopant has a thickness in a range of approximately 20 Å to 600 Å.

6. An organic electroluminescent device as claimed in claim 1 wherein the AMC dopant in the region of the organic material adjacent the cathode electrode has a concentration in a range of approximately 0.1 Wt % to 15 Wt %.

7. An organic electroluminescent device with enhanced performance comprising:

anode and cathode electrodes;

organic material positioned between the anode and cathode electrodes in juxtaposition to each of the electrodes, the organic material defining an electroluminescent region; and AMC dopant with a concentration in a range of approximately 0.1 Wt % to 15 Wt % in a region of the organic material having a thickness in a range of approximately 20 Å to 600 Å adjacent the cathode electrode.

8. An organic electroluminescent device as claimed in claim 7 wherein the AMC dopant includes one of an alkaline metal compound or an alkaline metal alloy.

9. An organic electroluminescent device as claimed in claim 8 wherein each of the alkaline metal compound and the alkaline metal alloy have a low work function.

10. An organic electroluminescent device as claimed in claim 8 wherein the alkaline metal alloy includes one of Li—Al, Li—In, Sr—Al, and Cs—Al.

* * * * *